United States Patent [19]

Bednorz et al.

[11] Patent Number: 4,698,502
[45] Date of Patent: Oct. 6, 1987

[54] FIELD-EMISSION SCANNING AUGER ELECTRON MICROSCOPE

[75] Inventors: Johannes G. Bednorz, Adliswil; James K. Gimzewski, Zurich; Bruno Reihl, Horgen, all of Switzerland

[73] Assignee: International Business Machines Corporation, Armonk, N.Y.

[21] Appl. No.: 821,946

[22] Filed: Jan. 24, 1986

[30] Foreign Application Priority Data

Jan. 29, 1985 [EP] European Pat. Off. ........... 85100892

[51] Int. Cl.$^4$ ...................... G01N 23/00; H01J 37/26
[52] U.S. Cl. .................................... 250/306; 250/310; 250/305
[58] Field of Search .................... 250/305, 306, 423 F, 250/310

[56] References Cited

U.S. PATENT DOCUMENTS

| | | | |
|---|---|---|---|
| 3,760,180 | 9/1973 | Weber | 250/305 |
| 3,809,899 | 5/1974 | Baker et al. | 250/423 F |
| 4,343,993 | 8/1982 | Bimmig et al. | 250/423 F |
| 4,550,257 | 10/1985 | Bimmig et al. | 250/423 F |
| 4,618,767 | 10/1986 | Smith et al. | 250/306 |

OTHER PUBLICATIONS

The Review of Scientific Instruments, vol. 43, No. 7, Jul. 1972, pp. 999–1011; R. Young et al., "The Topografiner: An Instrument for Measuring Surface Microtopography".
IBM Technical Disclosure Bulletin, vol. 24, No. 6, Nov. 1981, pp. 2855–2856, W. A. Thompson, "Mechanical Scanning Microscope".
"Vacuum-Tunneling Spectroscopy", Plummer et al. Physics Today, Apr. 1975, pp. 63–71, 250–423F.

Primary Examiner—Bruce C. Anderson
Attorney, Agent, or Firm—Alvin J. Riddles

[57] ABSTRACT

An Auger electron microscope is equipped with a field-emission tip maintained at an essentially constant distance above the surface of the specimen. The tip may consist of a tungsten (100) whisker having a radius of ~50 nm at the apex, the working distance being on the order of 1 mm. Auger electrons emitted from the surface of the specimen are collected by an electron energy analyzer for conventional processing. Mutual scanning displacement between the tip and specimen is obtained through use of an xyz-drive module, which is also responsible for adjusting the working distance of the tip. The entire microscope setup is mounted on vibration damping means and may be inserted into a vacuum system by means of an appropriate flange, if desired.

5 Claims, 2 Drawing Figures

FIELD-EMISSION SCANNING AUGER ELECTRON MICROSCOPE

DESCRIPTION

1. Field of the Invention

This invention relates to scanning Auger electron microscopes that are useful for spatially resolved investigation of elemental distributions, viz. grain boundaries, contamination, etc., on the surfaces of materials.

2. Background of the Invention

When a focused electron beam impinges on a specimen surface, a number of interactions with the atoms on or below the surface can occur. More specifically, if the incident electrons have enough energy, they ionize atoms by dislodging an inner shell electron. The atom spontaneously returns to its ground state by transferring an outer shell electron into the vacancy created in the inner shell. This relaxation of the atom is accompanied by a loss of energy caused by the emission of a photon of X-ray radiation and/or of an Auger electron, with the sum of the two being constant and there being a natural preference for the emission of Auger electrons. Since the electrons are at discrete energy levels, the emitted Auger electrons will also have a discrete energy equal to the energy difference between the initial and final states of the atoms. The energy level of the emitted Auger electrons is characteristic of the emitting element. Therefore, the Auger electron microscope is well suited to investigate the chemical composition of the material of the specimen, at least at its surface. Since the electron beam impinging on the specimen under investigation is narrowly focused, as is the detector, the information provided is always related to the composition at the focal point. In order to obtain composition information over a larger area, the electron beam and detector are raster-scanned across the area of interest and information is recorded for each point in the scan in accordance with the chosen resolution.

Scanning Auger electron microscopes are well known and commercially available. Usually, Auger microscopes employ an electron gun to generate the electron beam to be directed at the specimen, with the smallest beam diameter being about 35 nm. The resolution of the Auger analysis, however, is determined by the volume from which the electrons are emitted. The depth resolution normal to the surface of the specimen is determined by the effective escape depth which, in turn, is a function of the electron mean free path and of the takeoff angle. Because of the relatively low kinetic energy of the electrons, the depth resolution is only a few monolayers. If the spatial resolution were to be improved much further, the elemental resolution would be substantially degraded due to a degradation of the signal-to-noise ratio (which is a function of the primary beam current, typically below 1 nA for such resolution).

Auger microscopes employing electron guns are described by L. Reiner & G. Pfefferkorn in *Raster-Elektronen Mikroskopie*, (Springer-Verlag 1973) at page 182, and by J. I. Goldstein and H. Yakowitz (Editors) in *Practical Scanning Electron Microscopy*, (Plenum Press 1975) beginning at page 87.

Auger microscopes are also known in which the filament in the electron gun is replaced by a field-emission electron source. Representative of the prior art in this area are D. Tuggle, L. W. Swanson and J. Orloff, "Application of a Thermal Field-Emission Source for High Resolution, High Current e-Beam Microprobes," J. Vac. Sci. & Technol. Proceedings of the 15*th* Symposium on Electron, Ion, and Photon Beam Technology, Vol. 16, No. 6, pp. 1699–1703 (1979); and H. Todokoro, Y. Sakitani, S. Fuku- hara and Y. Okayima, "Development of a Scanning Auger Electron Microscope Equipped with a Field-Emission Gun," J. Electron Microsc. (Japan), Vol. 30, No. 2, pp. 107–113 (1981).

The Auger microscope of the Tuggle et al. reference employs a thermal field-emission electron source which uses two magnetic lenses to produce a beam spot of 100 nm diameter with a current of about 100 nA at 12 kV. The working distance of the field emission source from the specimen is about 13 cm. The emitter is tungsten coated with zirconium and is operated at 1800° K.

In the Todokoro et al. reference, a heatable fieldemission gun is used at a working distance above 10 cm from the specimen, receiving a current of 2 nA at 10 kV and permitting a resolution of 20 nm.

Shorter field-emission source/specimen distances are reported in R. Browning, P. J. Bassett, M. M. El Gomati and M. Prutton, "A Digital Scanning Auger Electron Microscope Incorporating a Concentric Hemispherical Analyser," Proc. R. Soc. Lond. A. 357, pp. 212–230 (1977), and M. M. El Gomati, M. Prutton and R. Browning, "An All-Electrostatic Small Beam Diameter, High Probe Current Field Emission Electron Probe," J. Phys. E.: Sci.Instrum., Vol. 18 pp. 32–38 (1985).

The Browning et al. reference is of particular interest since it contains information on energy analyzers which may be used in connection with the microscope of the present invention. The Browning et al. microscope, as well as the one described by El Gomati et al., employ electrostatic beam focusing and scanning techniques not used in the microscope to be described below.

High voltages and working distances above 5 cm are characteristic of the prior art Auger microscopes. Besides the danger usually involved with high voltage, these microscopes have the disadvantage of possibly causing damage on the specimens due to the high current densities at which they must be operated. Also, finefocus (i.e. sub-micrometer) electron excitation sources are cumbersome and expensive, and, because of their long working distance, suffer particularly from the principal limitation to which all high-resolution apparatus is exposed, namely mechanical vibration occurring between the specimen and the electron source and being transmitted by the vacuum chamber, which is itself vibrating. Another disadvantage of the prior art Auger microscopes is their size, in particular the size of the vacuum system which needs to be pumped down to, and maintained at, about $10^{-8}$ Pa.

DISCLOSURE OF THE INVENTION

These disadvantages of the prior art Auger electron microscopes are overcome by the field-emission scanning Auger electron microscope of the present invention, which comprises a field-emission source, a specimen support, scanning means for mutallly displacing the field-emission source and specimen, an electron detector with associated electronic data processing circuitry and means for displaying and/or recording the resulting energy spectrum. The microscope of the invention may be distinguished over the prior art in that the field-emission source consists of a sharply pointed tip having a tip radius of about 50 nm and being maintained at an essentially constant distance on the order of about 1 mm from the surface of the specimen, and in that an electrical potential exists between said tip and said specimen.

BRIEF DESCRIPTION OF THE DRAWINGS

Details of an embodiment of this invention will hereafter be explained by way of example with reference to the attached drawings, in which.

BEST MODE FOR CARRYING OUT THE INVENTION

Figure 1:
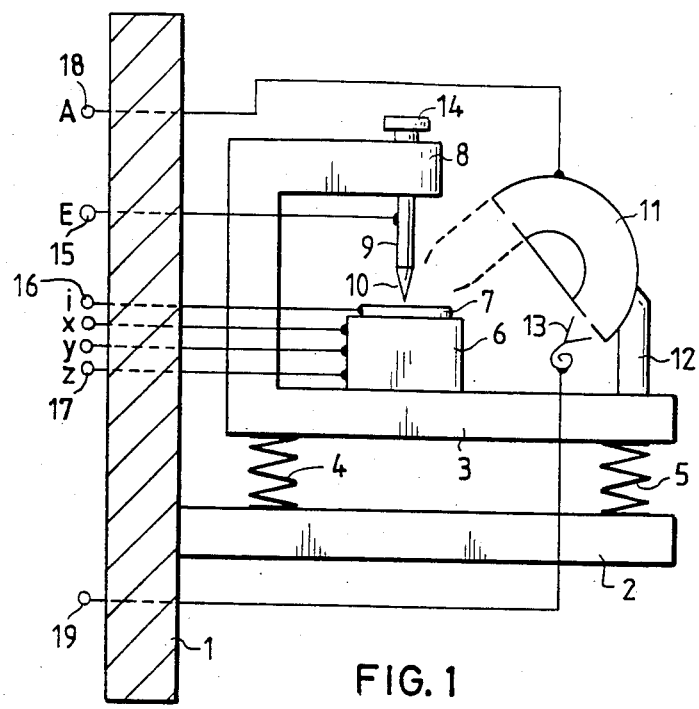
FIG. 1 is a schematic representation of the essential parts of a field-emission scanning Auger electron microscope in accordance with this invention.

FIG. 1 shows schematically the essential parts of an Auger microscope in accordance with the present invention, mounted on a 100 mm flange 1 which can be screwed into a vacuum system. Flange 1 carries a support 2 on which a frame 3 is suspended. The suspension is, for simplicity of the drawing, shown as springs 4 and 5 but may consist of a more elaborate vibration absorber. Arranged on frame 3 is an xyz drive module 6, for example one of the conventional type employing piezoelectric elements. The specimen 7 to be investigated is supported on the top of drive module 6. Extending from an upper arm 8 of frame 3 is field-emission source 9, which ends in a sharp tip 10 suspended at a very short distance above the surface of specimen 7. An electron energy analyzer 11 is held on a post 12 so as to collect the Auger electrons coming from the surface of specimen 7 when a potential E is applied between tip 10 and specimen 7.

Tip 10 is maintained above the surface of specimen 7 at an essentially constant distance on the order of 1 mm. Despite a possible roughness of the surface, it is relatively easy to control the distance to within a few nanometers. One conventional method is to measure the variation of the field-emission current i and to use this as an input to the z-coordinate drive of xyz drive module 6 while the specimen is scanned by displacement thereof in the xy-plane.

If, for example, a tungsten field-emission tip 10 with a (100) orientation is brought to within about 1 mm of a silicon (111) surface in a vacuum of $5 \times 10^{-11}$ mbar, with the silicon specimen 7 held at ground potential and the field-emission tip 10 negatively biased at 1 kV with respect to specimen 7, the field-emission current i will be on the order of 1 $\mu$A. This current is fed back to the z input of xyz drive module 6, and any deviation from a predetermined value (such as the 1 $\mu$A mentioned above) will cause module 6 to correspondingly adjust the distance of tip 10 from the surface of specimen 7.

It will be apparent to those skilled in this art that the electric field in the gap between tip 10 (which at the apex has an area of about 1 $\mu$m$^2$) and the surface of specimen 7 is highly inhomogeneous. As a consequence, the trajectories of the Auger electrons leaving the surface of specimen 7 will be somehow distorted. Despite this fact, and even though many Auger electrons are recaptured at the surface or do not make it to the energy analyzer 11, there is still an efficiency of about $10^{-3}$, i.e. for every 1000 primary electrons emitted from tip 10, one Auger electron will be caught to contribute to the output signal of the electron energy analyzer 11.

Electron energy analyzers of the type used in connection with the Auger electron microscope of the present invention are well known in the art and commercially available. In essence, such analyzers consist of a bent channel to which a discriminating potential may be applied, and an electron multiplier 13 attached thereto. Electrons entering the channel and having an energy corresponding to the potential applied to the channel 11 are propagated to the electron multiplier 13 where they create a greater number of secondary electrons. Electrons with energies not corresponding to the channel potential will not contribute to the output signal of the electron multiplier 13.

As is well known, the energy of the Auger electrons is characteristic of the emitting element. Thus, an analysis of the energy of the Auger electrons provides a clue as to the composition of the matter at the surface of the specimen. However, since Auger electrons are emitted only when an electron from an outer shell fills a vacancy created on an inner shell, hydrogen and helium are undetectable since they have only one shell. Most elements have Auger transitions which result in ejected electrons with energies generally between 50 and 2000 eV. These energies lie just above the energy range of the low-energy secondary electrons. The observed Auger electron spectrum consists of broad but relatively weak peaks. These are superimposed on a background "noise" to which the secondary and backscattered electrons contribute and which makes it very difficult to measure the positions of the Auger peaks. It is, therefore, common practice to obtain the first derivative of the electron distribution curve in order to suppress the unwanted background and to improve the signal-to-noise ratio so that the positions of the Auger peaks can be accurately measured.

As mentioned earlier, Auger microscopy can provide information on the composition of matter at the surface of the specimen. In fact, Auger electrons are emitted only from the few topmost atomic layers of the specimen, the exact number of the layers affected depending on the width and energy of the incident primary electron beam. While higher-energy primary electrons can generate Auger electrons at larger depths, due to their longer trajectories within the material, the characteristic energies of these Auger electrons either will be partially reduced or entirely absorbed by the production of secondary electrons prior to reaching the surface. Typically, the depth to which the surface of a specimen can be analyzed by Auger microscopy is about 0.1 to 1 nm for Auger electrons in the energy range of about 10 to 1000 eV.

Figure 2:
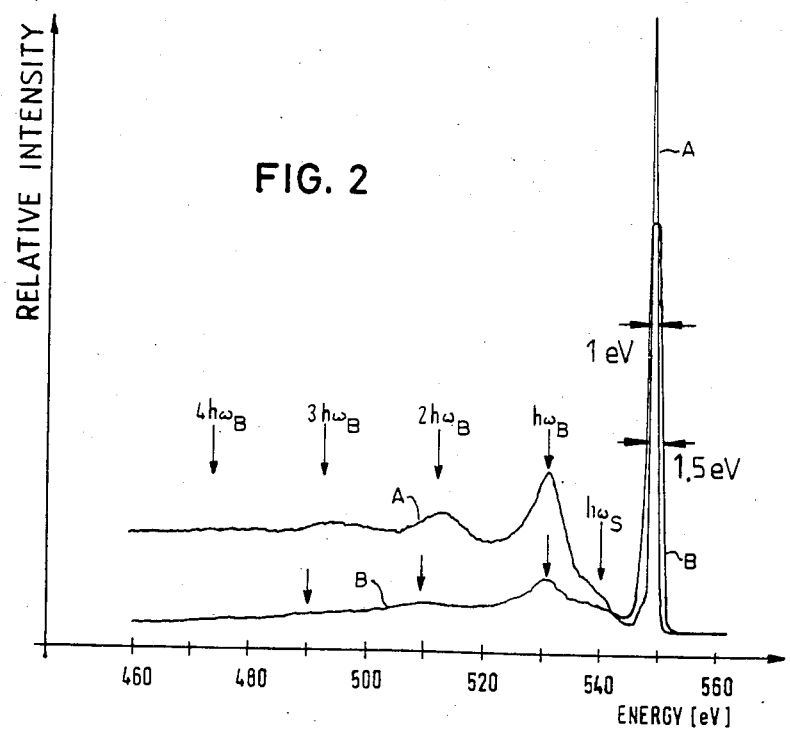
FIG. 2 is a graph comparing the performances of a conventional Auger electron microscope and the Auger electron microscope of the present invention.

FIG. 2 is a graph in which the performance of a conventional Auger electron microscope is compared to a field-emission Auger electron microscope in accordance with the present invention. Curve A in FIG. 2 shows the energy loss spectrum obtained with 547 eV primary electrons emitted by a commercially available electron gun. It has an elastic peak at 547 eV with a full-width at half-maximum value of 1 eV, and the energy losses due to the surface plasmons $h_{\omega S}$ at 6.3 eV below said peak, and due to the bulk plasmons $h_{\omega B}$ at 12.8 eV, 25.3 eV, 38.3 eV, and 50 eV, respectively, below said peak.

Curve B in FIG. 2 represents the analogous results obtained with a W(100) field-emission tip biased at $-547$ V and placed at a distance of 1 mm above the silicon surface. The elastic peak is, of course, at the same energy but with a slightly increased full-width at half-maximum value of 1.5 eV. The energy levels of the surface and bulk plasmons, respectively are somewhat reduced. This reduction as well as the width and intensity of the primary peak are geometry-dependent, an effect which increases with decreasing kinetic energy of the scattered electrons. The overall agreement of the conventional energy loss spectra and the field-emission energy loss spectra is very good and demonstrates the feasibility of local energy loss spectrum measurement with high spatial resolution.

It is to be particularly noted in connection with FIG. 2 that the electron beam responsible for curve A in this drawing had a diameter of about 2 mm, whereas the diameter of the electron beam emitted by the tip 10 of field-emission source 9 and leading to curve B had a diameter of about 100 nm, thus permitting a much higher lateral/spatial reoslution. To reduce the diameter of the conventional electron gun to the diameter easily achieved with the field-emission tip would require voltages well above 10 kV and electronic or magnetic focusing.

Vibrations affecting the system and degrading the signal-to-noise ratio also must be considered. Obviously, a system employing an electron beam length of more than 10 cm is much more prone to vibration disturbances than one where the critical distance is on the order of 1 mm.

As mentioned before, the scanning Auger electron microscope of the present invention includes a vibration damping system symbolically shown as springs 4 and 5 in FIG. 1. A very effective damping arrangement that may be employed in the microscope being described is described in IBM Technical Disclosure Bulletin, Vol. 27, No. 5, at page 3137.

In operation, tip 10 is brought to within the working distance from specimen 7 by some coarse adjustment means, e.g. a screw 14, and a potential difference is created between tip 10 and specimen 7 by applying a voltage E at a terminal 15, while the specimen is connected to ground. Tip 10 may, for example, consist of a tungsten whisker and be provided with a heating device to enhance the emission of electrons.

With a potential difference of about 1 kV between tip 10 and specimen 7, a field-emission current of about $0.5 \times 10^{-7}$ A will flow when the working distance is around 1 mm. The electron beam impinging upon the surface of specimen 7 will cause Auger electrons to be emitted therefrom, a portion of which will be collected by energy analyzer 11 whose entrance lens is at ground potential.

In view of the tungsten whisker having a very sharp apex (radius about 50 nm), the diameter of the emitted electron beam will be correspondingly narrow. Accordingly, the Auger electrons received in the energy analyzer provide composition information just for the small area of specimen 7 onto which the electron beam is incident. To obtain composition information on a larger area, specimen 7 is displaced in a stepwise fashion along the x and y coordinates by means of xyz drive module 6. Any surface roughness encountered during displacement and leading to a significant variation of the working distance between tip 10 and specimen 7 manifests itself through a corresponding variation in the field-emission current i at a terminal 16. Such variation is fed back to the z input 17 of drive module 6 to permit automatic adjustment of the working distance.

The Auger electrons leave the surface of specimen 7 in all directions a cone of which is collected by the entrance lens of energy analyzer 11. Via a terminal 18 a potential A is applied to analyzer 11 which causes the Auger electrons of the corresponding energy to proceed to electron multiplier 13. The output signal of multiplier 13 is available from a terminal 19 and can be processed by conventional data acquisition techniques.

Since Auger analysis is obtained from less than 1 nm of material in depth, the measurements may be impaired by even a few monolayers of surface contaminants, so that the composition of those contaminants actually may be analyzed rather than the composition of the bulk material of the specimen. Therefore, it may be necessary to perform the Auger measurements in a high-vacuum environment. Flange 1 of the setup shown in FIG. 1 is preferably designed to fit into an appropriate vacuum system.

Having thus described our invention, what we claim as new, and desire to secure by patent is:

1. A field-emission scanning Auger electron microscope comprising:
    a field-emission source;
    a support for a specimen;
        said support including scanning means for mutually displacing said field-emission source and said specimen;
    an electron detector with associated electronic data processing circuitry, said electron detector being commonly supported with said specimen;
    means for displaying and/or recording detected electrons,
    said field-emission source comprising a sharply pointed tip having a radius at the apex no larger than about 100 nanometers, said tip being maintained at an essentially constant distance on the order of about 1 mm from the surface of said specimen, and
    an electrical potential difference being maintained between said tip and said specimen.

2. A microscope in accordance with claim 1, wherein said tip is a tungsten whisker having a (100) orientation.

3. A microscope in accordance with claim 1, wherein said tip and said electron detector are mounted rigidly with respect to said specimen and said support for said specimen comprises an xyz-drive module.

4. A microscope in accordance with claim 1 wherein the potential difference between said tip and said specimen is adjustable between about 10 Volts and about 2000 Volts.

5. A microscope in accordance with claim 1, wherein said tip is biased negatively with respect to said specimen, said electron detector comprises an electron energy analyzer having an entrance lens, and said entrance lens and said specimen are connected to ground potential.

* * * * *